US006291874B1

United States Patent
Tamatsuka et al.

(10) Patent No.: US 6,291,874 B1
(45) Date of Patent: Sep. 18, 2001

(54) METHOD FOR PRODUCING SILICON SINGLE CRYSTAL WAFER FOR PARTICLE MONITORING AND SILICON SINGLE CRYSTAL WAFER FOR PARTICLE MONITORING

(75) Inventors: Masaro Tamatsuka; Katsuhiko Miki, both of Gunma-ken (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/313,680

(22) Filed: May 18, 1999

(30) Foreign Application Priority Data

Jun. 2, 1998 (JP) ................................. 10-169308

(51) Int. Cl.[7] ................................................ H01L 29/167
(52) U.S. Cl. ............................................ 257/610; 117/13
(58) Field of Search ..................... 438/471, 502, 438/503, 505, 918, 916, 974; 117/13, 19, 20; 257/610, 611, 617, 913

(56) References Cited

U.S. PATENT DOCUMENTS

| 5,629,216 | 5/1997 | Wijaranakula et al. . | |
| 5,795,381 | * 10/2000 | Holder | 117/14 |
| 6,077,343 | * 6/2000 | Iida et al. | 117/2 |
| 6,139,625 | * 10/2000 | Tamatsuka et al. | 117/19 |

FOREIGN PATENT DOCUMENTS

| 0170788A1 | 2/1986 | (EP) | C30B/15/04 |
| 0829559A1 | 3/1998 | (EP) | C30B/13/28 |
| 60251190 | 12/1985 | (JP) | C30B/15/04 |
| 2-267195 | 10/1990 | (JP) | C30B/29/06 |
| 05294780 | 11/1993 | (JP) | C30B/15/02 |
| 09260447 | 10/1997 | (JP) | H01L/21/66 |

OTHER PUBLICATIONS

Watanabe, et al., "(Invited) Controlled Oxygen Doping in Silicon," Japanese Journal of Applied Physics, Supplements vol. 22 (1983) Suppl. No. 22–1, Tokyo, Japan, pp. 185–189.
Shimura, et al., "Nitrogen Effect on Oxygen Precipitation in Czochralski Silicon," Applied Physics Letter 48 (1986) Jan., No. 3, New York, USA, pp. 224–226.
Shimura, F. and R. S. Hockett, "Nitrogen Effect on Oxygen Precipitation in Czochralski Silicon," 1986 American Institute of Physics, Appl. Phys. Lett. 48 (3), Jan. 20, 1986, pp. 224–226.
Abe, Takao and Hiroshi Takeno, "Dynamic Behavior of Intrinsic Point Defects in FZ and CZ Silicon Crystals," Mat. Res. Soc. Symp. Proc. vol. 262, 1992 Materials Research Society.

* cited by examiner

Primary Examiner—David Nelms
Assistant Examiner—Quoc Hoang
(74) Attorney, Agent, or Firm—Hogan & Hartson, L.L.P.

(57) ABSTRACT

There are disclosed a method for producing a silicon single crystal wafer for particle monitoring, which comprises growing a silicon single crystal ingot doped with nitrogen by the Czochralski method, and processing the single crystal ingot into wafers to produce the silicon single crystal wafer for particle monitoring; and a silicon single crystal wafer for particle monitoring, which is a silicon single crystal wafer for particle monitoring obtained by processing a silicon single crystal ingot into wafers, which ingot has been produced by the Czochralski method while doped with nitrogen. The method of the present invention can produce silicon single crystal wafers for particle monitoring having few pits on wafer surfaces with high productivity.

8 Claims, 1 Drawing Sheet

METHOD FOR PRODUCING SILICON SINGLE CRYSTAL WAFER FOR PARTICLE MONITORING AND SILICON SINGLE CRYSTAL WAFER FOR PARTICLE MONITORING

BACKGROUND OF THE INVENTION

1. Field of the Invention

The present invention relates to a method for producing a silicon single crystal wafer for particle monitoring having few pits on its wafer surface with high productivity.

2. Related Art

Particles adhered to a silicon single crystal wafer used for semiconductor devices may cause pattern breakage or the like during the production of semiconductor devices. In particular, because the pattern width of the most advanced devices (64M DRAM) is extremely small, i.e., 0.3 µm, production of such patterns suffers from abnormalities (failure) such as pattern breakage even by the presence of particles of 0.1 µm, and its production yield in the production of devices is markedly reduced. Therefore, particles adhered to silicon wafers must be decreased as far as possible.

To this end, in the production process of silicon wafers, particle counters are used to strictly control such particles (search of generation source, evaluation of cleaning effect, control of clean level of clean room, inspection of final products before shipment, etc.).

The measurement method of conventional particle counters involves, for example, irradiating a laser beam spot of around 10–100 µm on a wafer for monitoring of which particles are measured (wafer for particle monitoring), and effectively condensing feeble lights scattered by the particles through multiple optical fibers, integrating spheres or the like, which condensed lights are converted into electric signals by photoelectric devices. Therefore, conventional particle counters count the number of spots (bright spots) on the wafer surface where light scattering is caused.

By the way, minute crystal defects are generated during the growth of silicon single crystals, and they do not disappear during the cooling of crystals, and remain in the processed and produced wafers as they are. When these wafers are cleaned in a mixed solution of aqueous ammonia ($NH_4OH$+water) and aqueous hydrogen peroxide ($H_2O_2$+water) as generally conducted so as to remove the particles, hollows (pits) are formed on the wafer surfaces because etching rate is faster in the crystal defect sites (such pits are called crystal originated particles, COPs).

If such silicon wafers are used as wafers for particle monitoring, and particle number is counted on such wafers by the above particle counter, light scattering by not only particles actually adhered to the wafer surfaces, but also light scattering by such pits are detected. Thus, there has been a disadvantage that a true particle number cannot be obtained.

In particular, it has been known that a wafer produced from a silicon single crystal pulled by the CZ method generates much more COPs compared with a wafer produced from a silicon single crystal produced by the floating zone melting method (FZ method) and an epitaxial wafer comprising a wafer produced by the CZ method on which a silicon single crystal thin film is grown.

On the other hand, it has also been known that, in order to decrease crystal defects (COPs) introduced into silicon single crystals during their growth in the CZ method, marked improvement can be obtained by using an extremely low crystal growth rate (for example, 0.4 mm/min or less; see, for example, Japanese Patent Application Laid-open No. 2-267195).

However, if the crystal growth rate is simply lowered from the conventional rate of 1 mm/min or more to 0.4 mm/min or less, the productivity of single crystals would be halved or further reduced, and the cost would be markedly increased, even though COPs may be improved. This remained as a problem not only in the production of wafers used for devices, but also in the production of wafers for particle monitoring used for particle measurement.

SUMMARY OF THE INVENTION

The present invention has been accomplished in view of the aforementioned problems, and its object is to obtain silicon single crystals for particle monitoring having few crystal defects with high productivity by the CZ method.

To achieve the aforementioned object, the present invention provides a method for producing a silicon single crystal wafer for particle monitoring, characterized by comprising growing a silicon single crystal ingot doped with nitrogen by the Czochralski method, and processing the single crystal ingot into wafers to produce the silicon single crystal wafer for particle monitoring.

By doping a single crystal ingot with nitrogen during growing it by the CZ method as in the aforementioned method, growth of crystal defects occurring during the crystal growth can be suppressed. Further, as a result of suppression of the growth of crystal defects, the crystal growth rate can be made faster, and hence the productivity of crystals can be markedly improved.

In the aforementioned method, when the single crystal ingot doped with nitrogen is grown by the Czochralski method, concentration of nitrogen doped into the single crystal ingot is preferably controlled to be in a range of $1 \times 10^{10}$ to $5 \times 10^{15}$ atoms/cm$^3$.

The above range is defined, because the concentration of $1 \times 10^{10}$ atoms/cm$^3$ or more is preferred for sufficiently suppressing the growth of crystal defects, and because the concentration of $5 \times 10^{15}$ atoms/cm$^3$ or less is preferred in order not to inhibit the single crystallization of silicon crystals.

In the aforementioned method, after the single crystal ingot was processed into wafers to produce a silicon single crystal wafer, the silicon single crystal wafer is preferably subjected to a heat treatment so that nitrogen contained in a wafer surface portion should be out-diffused.

If the silicon single crystal wafer is subjected to a heat treatment so that nitrogen contained in a wafer surface portion should be out-diffused, the wafer surface layer would have extremely few crystal defects, and generation of oxide precipitate defects on the wafer surface due to acceleration of oxygen precipitation by nitrogen should be prevented, because the nitrogen is out-diffused. Further, when oxygen is also out-diffused at the same time by the heat treatment, the surface defect density can further be reduced. Therefore, the resulting wafers would become particularly suitable for wafers for particle monitoring.

Further, when the single crystal ingot doped with nitrogen is grown by the Czochralski method, concentration of oxygen contained in the single crystal ingot is preferably controlled to be $1.2 \times 10^{18}$ atoms/cm$^3$ or less (value according to ASTM '79).

Such a low oxygen concentration can further suppress the growth of crystal defects, and prevent the formation of oxide precipitates in the surface layer. Thus, the resulting wafers would become further suitable ones as wafer for the monitoring.

A silicon single crystal wafer for particle monitoring produced by the production method of the present invention is, for example, a silicon single crystal wafer for particle monitoring obtained by processing a silicon single crystal ingot into wafers, which ingot has been produced by the Czochralski method while doped with nitrogen.

In this wafer, the nitrogen concentration may be in a range of $1 \times 10^{10}$ to $5 \times 10^{15}$ atoms/cm$^3$, the nitrogen contained in a wafer surface portion may be out-diffused by a heat treatment, and the oxygen concentration may be $1.2 \times 10^{18}$ atoms/cm$^3$ or less.

Such a silicon single crystal wafer for particle monitoring having the aforementioned characteristics would have extremely few crystal defects in the surface layer. In particular, such a wafer may have a crystal defect density of the wafer surface of 30 defects/cm$^2$ or less, and use of such a wafer realizes accurate particle counting. Therefore, it is very useful for control of device fabrication process and the like.

According to the present invention, silicon single crystal wafers for particle monitoring having few crystal defects on wafer surfaces can be produced with high productivity. If the particle measurement is performed by using the silicon single crystal wafer for particle monitoring of the present invention, a true particle number can accurately be obtained because it causes extremely little light scattering due to pits on the wafer surface compared with a conventional wafer for particle monitoring. Therefore, it is extremely useful for the device fabrication process control or the like.

DESCRIPTION OF THE INVENTION AND EMBODIMENTS

Figure 1:
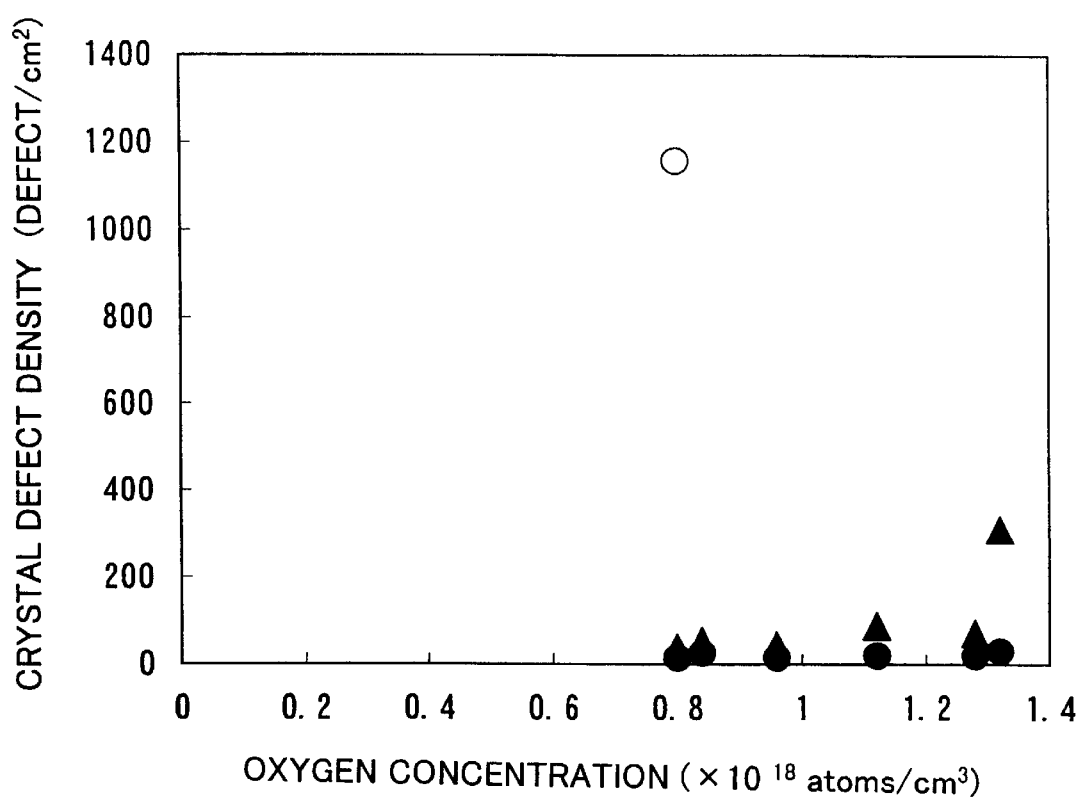
FIG. 1 is a graph representing results of measurement of surface crystal defect density by a particle counter, obtained in Examples and Comparative Example after one hour cleaning with SC-1 cleaning solution, as for wafers produced without nitrogen doping, or with nitrogen doping but without heat treatment, or with nitrogen doping and heat treatment.

The present invention will be explained more in detail hereinafter, but the present invention is not limited by this explanation.

The present invention has been accomplished based on the finding that silicon single crystal wafers for particle monitoring exhibiting few crystal defects in the wafer surface layer can be produced with high productivity by applying the nitrogen doping technique utilized for the silicon single crystal growing based on the CZ method to the production of wafers for particle monitoring, and based on investigation of various conditions therefor.

That is, it has already been pointed out that doping of nitrogen into silicon single crystals suppresses aggregation of vacancies in silicon (T. Abe and H. Takeno, Mat. Res. Soc. Symp. Proc. Vol. 262, 3, 1992). This effect is considered to be obtained by the fact that the vacancy aggregation process resulting formation of homogenous nucleation shifts to one resulting formation of heterogeneous nucleation. Therefore, if a silicon single crystal is doped with nitrogen during its growth by the CZ method, the silicon single crystal would have small sized crystal defects, and a silicon single crystal wafer for particle monitoring having a characteristic that has been desired in recent years can be obtained by processing such a silicon single crystal. In addition, this method does not necessarily require lowering the crystal growth rate unlike the aforementioned conventional method, and therefore it can afford silicon single crystal wafers for particle monitoring exhibiting few defects with high productivity.

Details of the present invention will further be explained hereinafter in the order of process steps for producing silicon single crystal wafers for particle monitoring, but the present invention is not limited to this explanation.

Growth of silicon single crystal ingot doped with nitrogen by the CZ method can be performed in a known manner described in, for example, Japanese Patent Application Laid-open No. 60-251190.

That is, in the CZ method, which comprises bringing a seed crystal into contact with starting polycrystal silicon melt contained in a quartz crucible, and slowly pulling the seed crystal with rotation to grow a silicon single crystal ingot of a desired diameter, the pulled crystal can be doped with nitrogen by introducing a nitride into the quartz crucible beforehand, adding a nitride into the melt, or employing an atmosphere containing nitrogen as the atmospheric gas. In such an operation, the doping amount in the crystal can be controlled by adjusting the amount of nitride, concentration of nitrogen gas, introduction time thereof and the like.

By doping a single crystal ingot with nitrogen during its growth by the CZ method, growth of crystal defects occurring during the crystal growth can be suppressed. Further, it does not require a low crystal growth rate, e.g., 0.4 mm/min or less, unlike the conventional method, and hence the productivity of crystals can be markedly improved.

The reason why the crystal defects are decreased by doping of silicon single crystal with nitrogen is considered that the vacancy aggregation process resulting formation of homogenous nucleation shifts to one resulting formation of heterogeneous nucleation as described hereinbefore.

Therefore, the concentration of the doped nitrogen is preferably at a level sufficiently causing formation of heterogeneous nuclei, i.e., $1 \times 10^{10}$ atoms/cm$^3$ or more, more preferably $5 \times 10^{13}$ atoms/cm$^3$ or more. Such a concentration sufficiently suppresses the growth of crystal defects.

On the other hand, if the nitrogen concentration exceeds $5 \times 10^{15}$ atoms/cm$^3$, which is the solid solubility limit in silicon single crystal, single crystallization of silicon crystal itself is inhibited, and hence the nitrogen concentration is selected so that it should not exceed the aforementioned value.

According to the present invention, when the single crystal ingot doped with nitrogen is grown by the CZ method, concentration of oxygen steps such as cleaning. The steps may also be used in a suitably modified manner such as alteration of the step sequence and omission of some steps depending on the purpose.

The nitrogen in the wafer surface portion may be out-diffused by subjecting the obtained silicon single crystal wafer to a heat treatment.

It has been known that nitrogen atoms in silicon single crystals promote oxygen precipitation (for example, F. Shimura and R. S. Hockett, Appl. Phys. Lett. 48, 224, 1986), and when they are doped into silicon single crystal wafers produced by the CZ method, defects due to oxygen precipitation such as OSF (oxidation-induced stacking fault) may be generated in the surface layer by heat treatment or the like.

The nitrogen in the wafer surface portion is out-diffused in order to eliminate bad influence on measurement of particles on the wafer surface, otherwise crystal defects influencing the measurement may be formed by oxygen precipitation in the wafer surface layer due to the aforementioned oxygen precipitation acceleration effect of nitrogen. This, together with the crystal defect growth suppressing effect of nitrogen during the crystal growth, can afford extremely low defect wafer surface layer. contained in the single crystal ingot is preferably controlled to be $1.2 \times 10^{18}$ atoms/cm$^3$ or less.

Such low oxygen concentration can, together with the contained nitrogen, further suppress the growth of crystal defects.

During the growing of silicon single crystal ingot, the contained oxygen concentration can be lowered to the aforementioned range by a conventional method. For example, an oxygen concentration in the aforementioned range can be readily obtained by means of decreasing crucible rotation speed, increasing introduced gas flow, reducing atmospheric pressure, control of temperature distribution and convection of silicon melt, and the like.

As described above, a silicon single crystal ingot doped with nitrogen at a desired concentration and containing oxygen at a desired concentration can be obtained. Such an ingot can be sliced by a slicing machine such as inner diameter slicer or wire saw, and processed into a silicon single crystal wafer through various process steps such as bevelling (chamfering), lapping, etching, and polishing in conventional manners. Of course, these steps are merely exemplary steps, and there can be various other precision of particle measurement can be extremely improved by using the aforementioned wafer as a wafer for particle monitoring.

EXAMPLES

The present invention will be explained more specifically hereinafter with reference to examples of the present invention and comparative example, but the present invention is not limited to them.

Examples and Comparative Example

According to the CZ method, 40 kg of starting polycrystal silicon was charged in a quartz crucible having a diameter of 18 inches, and 5 crystal ingots of P type having crystal orientation <100> and a diameter of 6 inches were pulled at a usual pulling rate, 1.0 mm/min. For the pulling of 4 ingots among them, the starting material, polycrystal silicon, was melted together with silicon wafers having silicon nitride films, whereas the remained one ingot was not doped with nitrogen. For each crystal, the rotation of the crucible was controlled during the pulling so that the oxygen concentration in the single crystal should become to be $1.3 \times 10^{18}$ atoms/cm$^3$ or less (ASTM '79).

In such a case, because diffusion velocity of nitrogen in silicon is much faster than that of oxygen, nitrogen in the surface portion can surely be out-diffused by a heat treatment.

As for specific conditions of the heat treatment to out-diffuse nitrogen in the wafer surface, it is preferably performed, for example, at a temperature of 900° C. to the melting point of silicon.

The heat treatment within the aforementioned temperature range can sufficiently out-diffuse nitrogen in the wafer surface layer, and simultaneously out-diffuse oxygen. Therefore, the generation of defects due to oxide precipitates in the surface layer can be substantially completely prevented.

Thus, there can be obtained the silicon single crystal wafer for particle monitoring of the present invention, which is obtained by processing a silicon single crystal ingot into wafers, which ingot has been produced by the Czochralski method while doped with nitrogen.

Such a silicon single crystal wafer for particle monitoring has extremely few crystal defects in the surface layer, and in particular it can have a crystal defect density on the wafer surface of 30 defects/cm$^2$ or less. Therefore, When the nitrogen concentration of the tail portions of the crystal ingots doped with nitrogen was measured by FT-IR, it was $5.0 \times 10^{14}$ atoms/cm$^3$ on average (since the segregation coefficient of nitrogen is extremely small, the concentration of the straight bodies would become smaller than that value). Further, oxygen concentration was measured by FT-IR for all of the single crystal ingots, and it was confirmed that it was about $1.3 \times 10^{18}$ atoms/cm$^3$ or less for all of the crystals.

Wafers were sliced from the obtained single crystal ingots by using a wire saw, and processed by bevelling (chamfering), lapping, etching, and mirror surface polishing in the substantially same conditions to afford 2 kinds of mirror surface silicon single crystal wafers having a diameter of 6 inches, which were different in either they were doped or not doped with nitrogen.

The above obtained two kinds of silicon single crystal wafers for particle monitoring were cleaned with SC-1 cleaning solution having a composition of NH$_4$OH:H$_2$O$_2$:H$_2$O=1:1:5 for one hour, and particles having a size of not less than 0.13 μm on the surfaces were counted by a particle counter. The results of the measurement are shown in FIG. 1. The black triangles represent the results of the wafers doped with nitrogen according to the present invention, and the white circles represent the results of the conventional wafers not doped with nitrogen.

It can be seen from these results that the method of the present invention, which utilized doping with nitrogen, reduced the crystal defect density to about one-20th or less of that obtained by the conventional method, despite the fact that the pulling was performed at a rate of 1.0 mm/min, equivalent to or higher than the conventional rate. That is, it can be seen that the doping with nitrogen suppressed growth of crystal defects and number of crystal defects which can be detected by a particle counter is decreased. Further, as for the oxygen concentration, it can be seen that the crystal defect density was slightly elevated when it exceeded $1.2 \times 10^{18}$ atoms/cm$^3$.

Then, among the aforementioned wafers, the wafers doped with nitrogen were subjected to a heat treatment at 1200° C. for 30 seconds to out-diffuse nitrogen or oxygen in the wafer surface portion. As the atmospheric gas, a mixed gas atmosphere of 75% argon and 25% hydrogen was used. Then, the wafers were similarly cleaned with the aforementioned SC-1 cleaning solution for one hour, and particles having a size of not less than 0.13 μm on the surfaces were counted by a particle counter. The results of the measurement are shown in FIG. 1 by plotting with the black circles.

As seen from these results, the crystal defect density was further decreased by diffusing nitrogen in the wafer surface portion outward, and the crystal defect density was decreased to a level of about one-40th or less of the level obtained by the conventional method. That is, it can be understood that the generation and growth of crystal defects which can be detected by a particle counter are greatly suppressed by doping with nitrogen and out-diffusing nitrogen in the wafer surface portion. In particular, the crystal defect density of 30 defects/cm$^2$ or less in the wafer surface portion can be ensured.

The present invention is not limited to the embodiments described above. The above-described embodiments are mere examples, and any of those having the substantially same structure as that described in the appended claims and providing the similar functions and advantages are included in the scope of the present invention.

For example, when a silicon single crystal ingot is grown by the Czochralski method according to the present invention, a melt may or may not be applied with a magnetic field, and therefore the Czochralski method used for the present invention include the so-called MCZ method in which a magnetic field is applied.

Further, though it was demonstrated that the crystal defects could further be lowered at a low concentration of the contained oxygen in the above description, the present invention can exhibit the advantages even at a higher oxygen concentration, e.g., 1.2 to $1.5 \times 10^{18}$ atoms/cm$^3$ or higher.

What is claimed is:

1. A silicon single crystal wafer for particle monitoring, wherein it is a silicon single crystal wafer for particle monitoring obtained by processing a silicon single crystal ingot into wafers, which ingot has been produced by the Czochralski method while doped with nitrogen.

2. The silicon single crystal wafer for particle monitoring according to claim 1, wherein nitrogen concentration of the silicon single crystal wafer for particle monitoring is in a range of $1 \times 10^{10}$ to $5 \times 10^{15}$ atoms/cm$^3$.

3. The silicon single crystal wafer for particle monitoring according to claim 2, wherein crystal defect density of the wafer surface is 30 defects/cm$^2$ or less.

4. The silicon single crystal wafer for particle monitoring according to claim 1, wherein nitrogen contained in a wafer surface portion is out-diffused by a heat treatment.

5. The silicon single crystal wafer for particle monitoring according to claim 4, wherein crystal defect density of the wafer surface is 30 defects/cm$^2$ or less.

6. The silicon single crystal wafer for particle monitoring according to claim 1, wherein oxygen concentration in the silicon single crystal wafer for particle monitoring is $1.2 \times 10^{18}$ atoms/cm$^3$ or less.

7. The silicon single crystal wafer for particle monitoring according to claim 6, wherein crystal defect density of the wafer surface is 30 defects/cm$^2$ or less.

8. The silicon single crystal wafer for particle monitoring according to claim 1, wherein crystal defect density of the wafer surface is 30 defects/cm$^2$ or less.

* * * * *